US012770694B2

(12) United States Patent
Vijayvergia et al.

(10) Patent No.: US 12,770,694 B2
(45) Date of Patent: *Oct. 20, 2026

(54) CIRCUIT AND METHOD FOR ON-CHIP LEAKAGE DETECTION AND COMPENSATION FOR MEMORIES

(71) Applicant: STMicroelectronics International N.V., Geneva (CH)

(72) Inventors: Arpit Vijayvergia, Bhopal (IN); Vikas Rana, Noida (IN)

(73) Assignee: STMicroelectronics International N.V., Geneva (CH)

( * ) Notice: Subject to any disclaimer, the term of this patent is extended or adjusted under 35 U.S.C. 154(b) by 104 days.

This patent is subject to a terminal disclaimer.

(21) Appl. No.: 18/807,793

(22) Filed: Aug. 16, 2024

(65) Prior Publication Data

US 2025/0029664 A1 Jan. 23, 2025

Related U.S. Application Data

(62) Division of application No. 17/548,096, filed on Dec. 10, 2021, now Pat. No. 12,087,368.

(60) Provisional application No. 63/131,730, filed on Dec. 29, 2020.

(51) Int. Cl.

| | |
|---|---|
| ***G11C 16/28*** | (2006.01) |
| ***G11C 16/04*** | (2006.01) |
| ***G11C 16/24*** | (2006.01) |

(52) U.S. Cl.

CPC .......... *G11C 16/28* (2013.01); *G11C 16/0458* (2013.01); *G11C 16/24* (2013.01)

(58) Field of Classification Search

CPC ..... G11C 16/28; G11C 16/0458; G11C 16/24; G11C 16/26; G11C 29/02; G11C 29/12; G11C 29/1201

USPC .................................................. 365/129, 205

See application file for complete search history.

(56) References Cited

U.S. PATENT DOCUMENTS 6,608,786 B2 8/2003 Somasekhar et al.
6,667,902 B2 * 12/2003 Peng .................. G11C 11/5692 365/189.11
6,873,561 B2 3/2005 Ooishi
7,085,184 B1 * 8/2006 Walther ................... G11C 7/12 365/207
7,161,844 B2 1/2007 Sarin et al.
7,248,494 B2 7/2007 Oh et al.
7,573,748 B2 8/2009 Bedarida et al.
7,848,171 B2 12/2010 Miyako
8,208,337 B2 * 6/2012 Liao ......................... G11C 7/12 365/185.09

(Continued)

FOREIGN PATENT DOCUMENTS

CN 102426858 B 7/2014
CN 109949837 A 6/2019
TW I320934 B * 2/2010

*Primary Examiner* — Michael T Tran

(74) *Attorney, Agent, or Firm* — Seed Intellectual Property Law Group LLP

(57) ABSTRACT

An integrated circuit includes a memory array and a memory read circuitry for reading data from the memory array. The memory read circuitry includes a leakage current compensation circuit. The leakage current compensation circuit senses the leakage current in a bitline of the memory array during a read operation and generates a leakage compensation current to offset the leakage current during the read operation.

20 Claims, 11 Drawing Sheets

(56) References Cited

U.S. PATENT DOCUMENTS

| | | | | |
|---|---|---|---|---|
| 8,289,775 | B2 | 10/2012 | Lee et al. | |
| 9,236,120 | B2 * | 1/2016 | Papandreou | G11C 11/5678 |
| 9,384,815 | B2 * | 7/2016 | Chen | H10B 41/60 |
| 11,114,160 | B2 * | 9/2021 | Gangasani | G11C 13/0033 |
| 2005/0047232 | A1 * | 3/2005 | Shimadu | G11C 5/14 365/203 |
| 2006/0002175 | A1 * | 1/2006 | Yamamoto | G11C 16/26 365/149 |
| 2006/0221754 | A1 * | 10/2006 | Abe | G11C 7/12 365/230.03 |
| 2008/0013379 | A1 * | 1/2008 | Lin | G11C 16/24 365/208 |
| 2008/0170442 | A1 * | 7/2008 | Bedarida | G11C 29/12 365/210.11 |
| 2009/0251979 | A1 * | 10/2009 | Chang | G11C 5/147 365/203 |
| 2012/0262993 | A1 * | 10/2012 | Moschiano | G11C 16/0483 327/52 |
| 2014/0078831 | A1 * | 3/2014 | Mietus | G11C 16/28 365/185.21 |
| 2019/0198098 | A1 * | 6/2019 | Yang | G11C 13/004 |
| 2020/0111529 | A1 * | 4/2020 | Shin | G11C 7/12 |

* cited by examiner

CIRCUIT AND METHOD FOR ON-CHIP LEAKAGE DETECTION AND COMPENSATION FOR MEMORIES

BACKGROUND

Technical Field

The present disclosure is related to management of memory arrays, and more particularly to management of leakage currents in memory arrays.

Description of the Related Art

Computer readable memories are utilized to store data for electronic systems. The electronic systems can include computing systems such as desktop computers, laptop computers, tablets, and smartphones. Memory arrays can be utilized as global storage for these electronic systems or as storage for individual components or circuits of the electronic systems.

When data is read from a memory array, the data in one or more memory cells is sensed by read circuitry associated with the memory array. The value of the data stored in the memory cell is sensed based on electrical properties associated with the memory cell. However, in some instances it is possible that electrical effects from other memory cells or from signal lines associated with the memory array can interfere with properly sensing the data in the memory cell. If this happens, then the data value in the memory cell may be erroneously sensed. This can lead to problems associated with the operation of electronic systems or components of electronic systems.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a memory array and associated memory reading circuitry that can accurately and efficiently read data from memory cells of the memory array. The memory reading circuitry identifies electrical signals that may interfere with a memory read operation and compensates for those electrical signals during the read operation. This helps ensure that data will be accurately read from the memory cells of the memory array.

In one embodiment, the memory cells are arranged in rows and columns. Each column of memory cells is coupled to a respective bitline. A read operation of a selected memory cell is performed by comparing the current on the bitline coupled to that memory cell to a reference current in a reference bitline. During the read operation of the memory cell, the memory reading circuitry senses a leakage current on the bitline coupled to the selected memory cell. The memory reading circuitry adds the same amount of leakage current to the reference bitline. This ensures that the leakage current will not result in a faulty read operation of the memory cell because the same leakage current is added to the reference bitline.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. For example, some well-known components and circuits associated with memory arrays have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
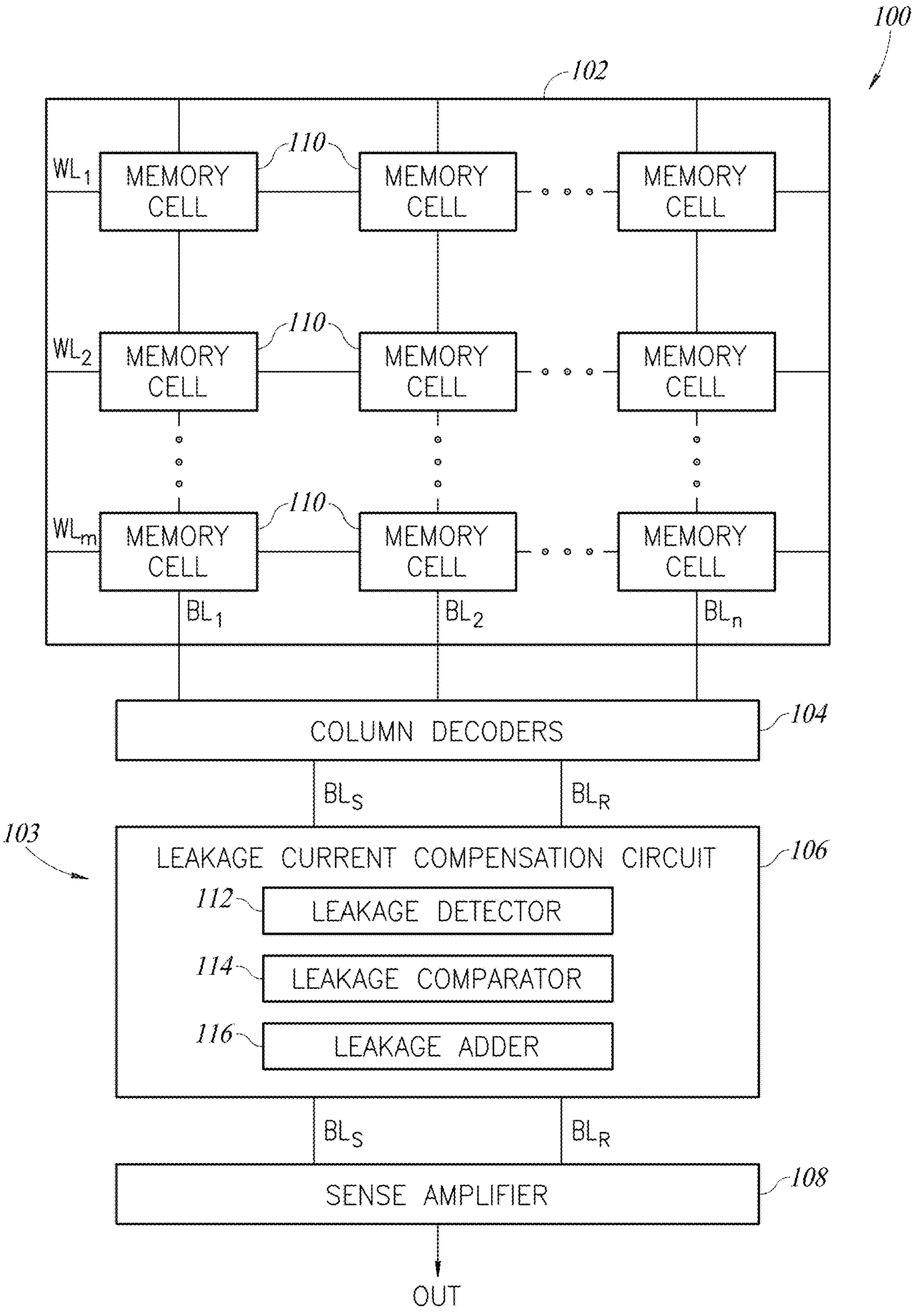
FIG. 1 is a schematic diagram of an integrated circuit including a memory array and associated memory reading circuitry, according to one embodiment.

FIG. 1 is a schematic diagram of an integrated circuit 100, according to one embodiment. The integrated circuit 100 includes a memory array 102 and memory reading circuitry 103 associated with the memory array 102. The memory array stores data. The memory reading circuitry 103 reads data from the memory array 102. As will be set forth in more detail below, the memory reading circuitry 103 senses leakage currents during memory read operations and compensates for those leakage currents. This helps ensure that memory operations accurately read data from the memory array 102

The memory array 102 includes a plurality of memory cells 110. Each memory cell 110 stores in binary data value, either 0 or 1. The plurality of memory cells 110 are arranged in rows and columns. Each row of memory cells 110 is coupled to a respective wordline WL. Each column of memory cells is coupled to a respective bitline BL. The example of FIG. 1 there are n bitlines and m wordlines.

In one example, the memory array 102 includes floating gate transistors. The floating gate transistors have floating gates. Data is stored in or erased from the floating gates by driving a write current or an erase current through the channel region of the floating gate transistors. Electrons tunnel through the channel to the floating gate or from the floating gate to the channel as the case may be to store data or erase data from the floating gate. The tunneling process is known as Fowler-Nordheim tunneling. While the present disclosure primarily describes embodiments in which the memory cells 110 include floating gate transistors as storage devices, other types of nonvolatile memory cells can be utilized without departing from the scope of the present disclosure. Furthermore, principles of the present disclosure can extend to memory arrays other than non-volatile memory arrays.

The read circuitry 103 includes column decoders 104. The column decoders 104 include column decoder transistors that can be operated to select a bitline for the memory operation. While embodiments are described primarily in relation to read operations, the column decoders 104 also select bitlines for program and erase operations. Though not shown in FIG. 1, the read circuitry 103 also includes row decoders for selecting a wordline. A particular memory cell is selected for a read operation by selecting the wordline and the bitline that is connected to that memory cell.

The read circuitry 103 includes a sense amplifier 108. The sense amplifier 108 senses the data value in a selective memory cell 110. During a read operation a memory cell 110 is selected for a read operation. The column decoder 104 electrically couples the bitline of the selected memory cell to a sensing bitline BLS. The sensing bitline BLS is coupled between the column decoders 104 in the sense amplifier 108. The row decoder 104 also couples a reference bitline BLR to the sense amplifier 108. During the read operation, the sense amplifier compares the current in the sensing bitline BLS to the current and the reference bitline BLR. The value in the memory cell 110 is indicated by whether the sense current in the sensing bitline is greater than or less than the reference current in the reference bitline.

When a memory cell 110 is selected for a read operation, the current in the corresponding bitline is based, in part, on the value of the data stored in the memory cell 110. In the example of a floating gate transistor memory cell, the amount of charge stored in the floating gate of the selected memory cell influences the amount of current that will flow through the corresponding bitline. A selection transistor of the memory cell 110 is typically enabled to allow current to flow through the channel of the floating gate memory cell into the bitline. The other memory cells 110 connected to the bitline are not enabled during the read operation.

Even though the other memory cells 110 connected to the bitline are not enabled during the read operation, a small amount of leakage current may nevertheless flow through the bitline from each of the memory cells 110 coupled to the bitline. If the total leakage current from these memory cells 110 is sufficiently high, then it is possible that the sense amplifier 108 will incorrectly sense the data value. For example, if the data value in the selected memory cell 110 is such that the sense current on the sensing bitline BLS should be lower than the reference current on the reference bitline BLR, but the total leakage current from the memory cells coupled to the bitline is high enough to cause the sense current in the sensing bitline BLS to be higher than the reference current and the reference bitline, then the data value output by the sense amplifier 108 will be wrong.

Each memory cell 110 may output a different amount of leakage current based on process variations and other factors. Accordingly, in some bitlines the total leakage current may be quite low due to the characteristics of the memory cells 110 coupled to the bitline, while on other bitlines the leakage current may be quite high due to the characteristics of the memory cells 110 coupled to the bitline. Thus, it may not be feasible to simply predict the same leakage currents for every bitline.

The integrated circuit 100 of FIG. 1 addresses the leakage current issue with a leakage current compensation circuit 106. The leakage current compensation circuit 106 senses the leakage current on the sensing bitline BLS and adds that same amount of current to the reference current flowing in the reference bitline BLR. The current data by the leakage current compensation circuit 106 to the reference bitline BLR is a compensation current. Because the same amount of leakage current is added to the reference current flowing through the reference bitline BLR, the amount of leakage current flowing in the sensing bitline BLS cannot affect the sensing operation performed by the sense amplifier 108.

In one example, the reference bitline BLR is not connected to any memory cell or bitline of the memory array 102, but is simply provided with a reference current. The reference current is selected to have a value between an expected sense current for a data value of 0 and an expected sense current for a data value of 1.

In other examples, the memory array 102 includes, for each memory cell, a complementary memory cell and a complementary array. The complementary memory cell stores the opposite data value as the corresponding memory cell 110. For example, if the memory cell coupled to a first wordline WL1 and a first bitline BL1 stores a data value of 0, then the corresponding complementary memory cell in the complementary array will store a data value of 1. The reference bitline BLR is coupled to the complementary bit cell. The reference current in the complementary bit cell is the current from the complementary bitline in the complementary array. The sense amplifier 108 outputs a data value based on whether the current in the sensing bitline BLS is less than the current and the reference bitline BLR. This is known as differential sensing.

In the case of differential sensing, the leakage current compensation circuit 106 senses the leakage current in the reference bitline BLR and adds that leakage current to the current in the sensing bitline BLS. The leakage current compensation circuit 106 also adds the leakage current from the sensing bitline BLS to the reference current and the reference bitline BLR.

In one embodiment, the leakage current compensation circuit includes a leakage detector 112. The leakage detector 112 detects the magnitude of leakage current. Typically, the leakage current detector 112 detects the magnitude of leakage current in the sensing bitline BLS before the selected memory cell 110 is enabled. For example, prior to enabling the selected memory cell 110, the corresponding bitline is precharged. After the bitline is precharge, the selected memory cell 110 is enabled in the data value is determined by the sense amplifier 108. The leakage detector 112 senses the leakage current after the bitline has been pre-charged up before the selected memory cell 110 has been enabled.

In the example of a differential sensing configuration, the leakage detector 112 also detects the leakage current in the reference bitline BLR. In particular, the leakage. The leakage detector 112 detects the leakage current in the reference bitline BLR after the reference bitline BLR has been precharged but before the complementary memory cell has been enabled.

In one embodiment, the leakage current compensation circuit 106 includes a leakage comparator. In some cases the leakage current may be sufficiently low that there is not a risk of causing an erroneous read operation. Accordingly, a leakage comparator 114 compares the leakage current in the sensing bitline BLS to a threshold current. If the leakage current is less than the threshold current (or less than or equal to the threshold current, as the case may be), then the leakage comparator 114 outputs a signal indicating that a leakage compensation current does not need to be added to the reference bitline BLR. In this case, the leakage current compensation circuit 106 will not add a leakage current to the reference bitline BLR. This saves power because the leakage compensation current will be generated if the leakage current is sufficiently large.

In one embodiment, the leakage current compensation circuit 106 includes a leakage adder. The leakage adder is the circuit that adds the leakage compensation current to the reference bitline. In particular, after the leakage detector 112 senses the magnitude of the leakage current, a leakage adder 116 generates a leakage compensation current of the same magnitude as the leakage current and adds the leakage compensation current to the reference bitline BLR. In the example of a differential read configuration, the leakage adder 116 adds the leakage current sensed and the reference bitline BLR to the sensing bitline BLS.

Though the reference bitline BLR is shown as coming from the column decoders 104, this may not be the case in the example of a differential read configuration. If the read configuration is not a differential read configuration, i.e., the reference bitline BLR is not coupled to a complementary bitline of the complementary memory array, then the reference bitline BLR may not be coupled between the column decoders 104 and the sense amplifier 108 as no column decoding is used in this case for the reference bitline BLR.

Figure 2:
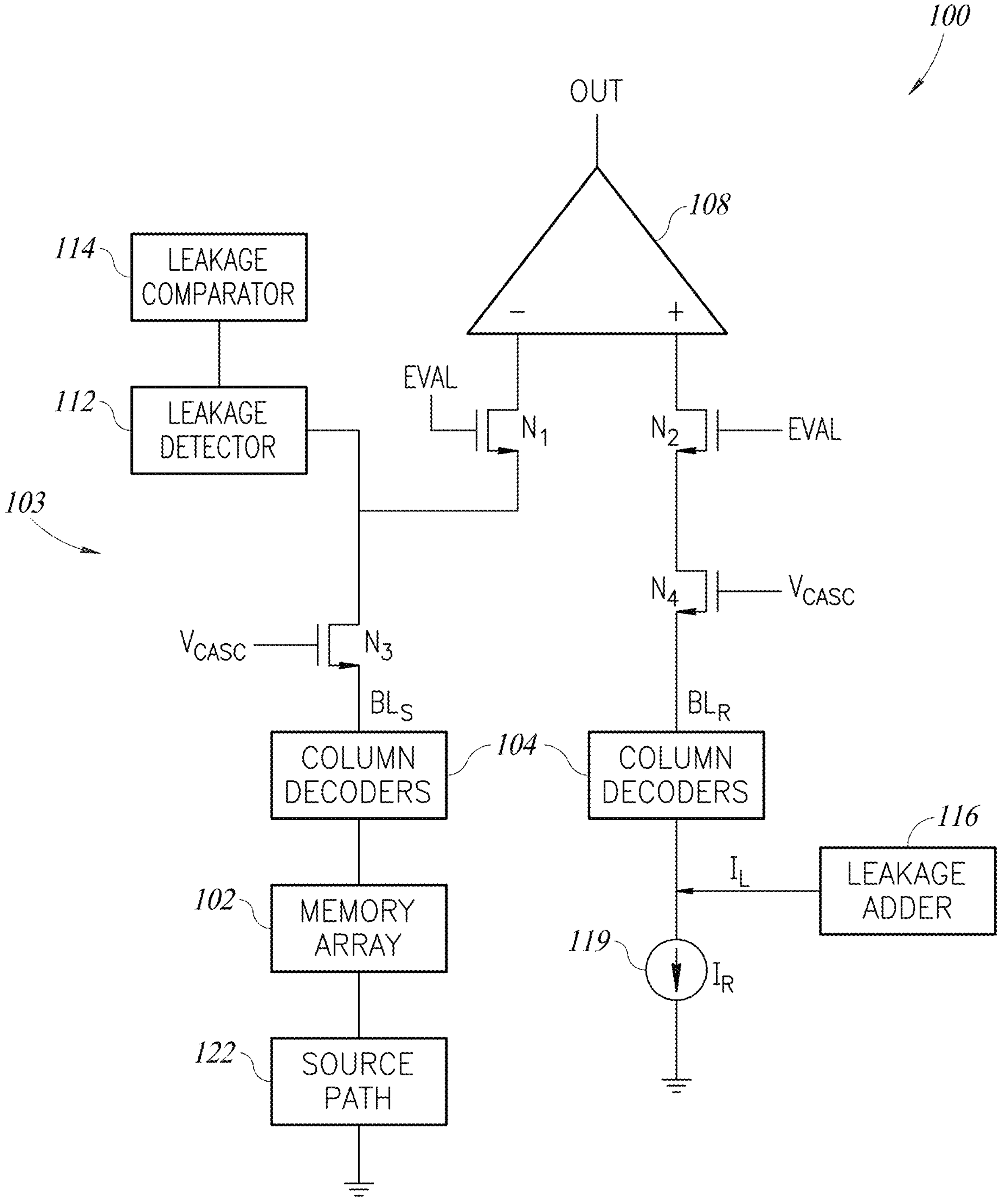
FIG. 2 is a schematic diagram of memory reading circuitry of an integrated circuit, according to one embodiment.

FIG. 2 is a schematic diagram of an integrated circuit 100, according to one embodiment. In FIG. 2, the sense amplifier 108 includes an inverting input "–" and a noninverting input "+". The inverting input receives the sensing bitline BLS from the column decoders 104. The noninverting input receives the reference bitline BLR from the column decoders 104. NMOS transistors N1 and N3 are coupled between the noninverting input of the sense amplifier 108 and the column decoders 104. NMOS transistors N2 and N4 are coupled between the inverting input of the sense amplifier 108 and the column decoders 104.

During a read operation, a memory cell 110 of the memory array 102 is selected for the read operation. The column decoders 104 couple the corresponding bitline of the memory array 102 to the sensing bitline BLS such that a current flowing through the sensing bitline BLS also flows through the selected bitline of the memory array 102. FIG. 2 also indicates a source path 122 coupled between the memory array 102 and ground. In practice, the source path 122 includes source line transistors that are enabled in order to allow a current to flow through the selected bitline of the memory array 102 to ground.

The gate terminals of the transistors N1 and N2 each receive an evaluation signal EVAL. When the evaluation signal EVAL is low, the transistors N1 and N2 are not conducting and the sense current and reference current will flow through the sensing bitlines BLS and BLR to the inputs of the sense amplifier 108. When the evaluation signal is high, the transistors N1 and N2 are conducting and the sense current and the reference current will flow through the sensing bitline BLS and the reference current will flow to the reference bitline BLR to the inputs of the sense amplifier 108. Accordingly, EVAL goes high for the final part of a read operation.

The transistors N2 and N4 are cascode transistors. The transistors N2 and N4 receive a cascode voltage Vcasc on their gate terminals. The value of Vcasc is selected to bias the voltage on the sensing bitline BLS and the reference bitline BLR during read operations by affecting the voltage drop across transistors in the sensing bitline and reference bitline path.

The leakage detector 112 is coupled to the sensing bitline BLS. The leakage detector 112 is utilized to sense the value of the leakage current in the sensing bitline BLS. After the sensing bitline is precharge and before EVAL goes high, the leakage detector 112 is enabled. The source path 122 is also enabled so that the leakage current can flow through the sensing bitline BLS. The leakage detector 112 detects the value of the leakage current before EVAL goes high.

After the leakage detector 112 detects the value of leakage current, the leakage comparator 114 compares the value of the leakage current to a threshold value. If the leakage current is higher than the threshold value, then the leakage comparator 114 enables the leakage adder 116.

When EVAL goes high, the leakage adder 116 adds the leakage current IL to the reference bitline BLR. During the read operation, when EVAL is high, a current generator 119 generates a reference current IR. The combination of the reference current IR and leakage current IL flows through the reference bitline BLR. During the read operation, the sense current IS flows through the sensing bitline BLS. The sense current is a combination of the current flowing through the selected memory cell and the leakage current flowing from the other memory cells coupled to the selected bitline. Because the leakage current is added to the reference bitline BLR, the leakage current does not affect the sensing operation performed by the sense amplifier 108. The sensing operation corresponds to a simple comparison of the currents flowing through the reference bitline BLR in the sensing bitline BLS.

Figure 3A:
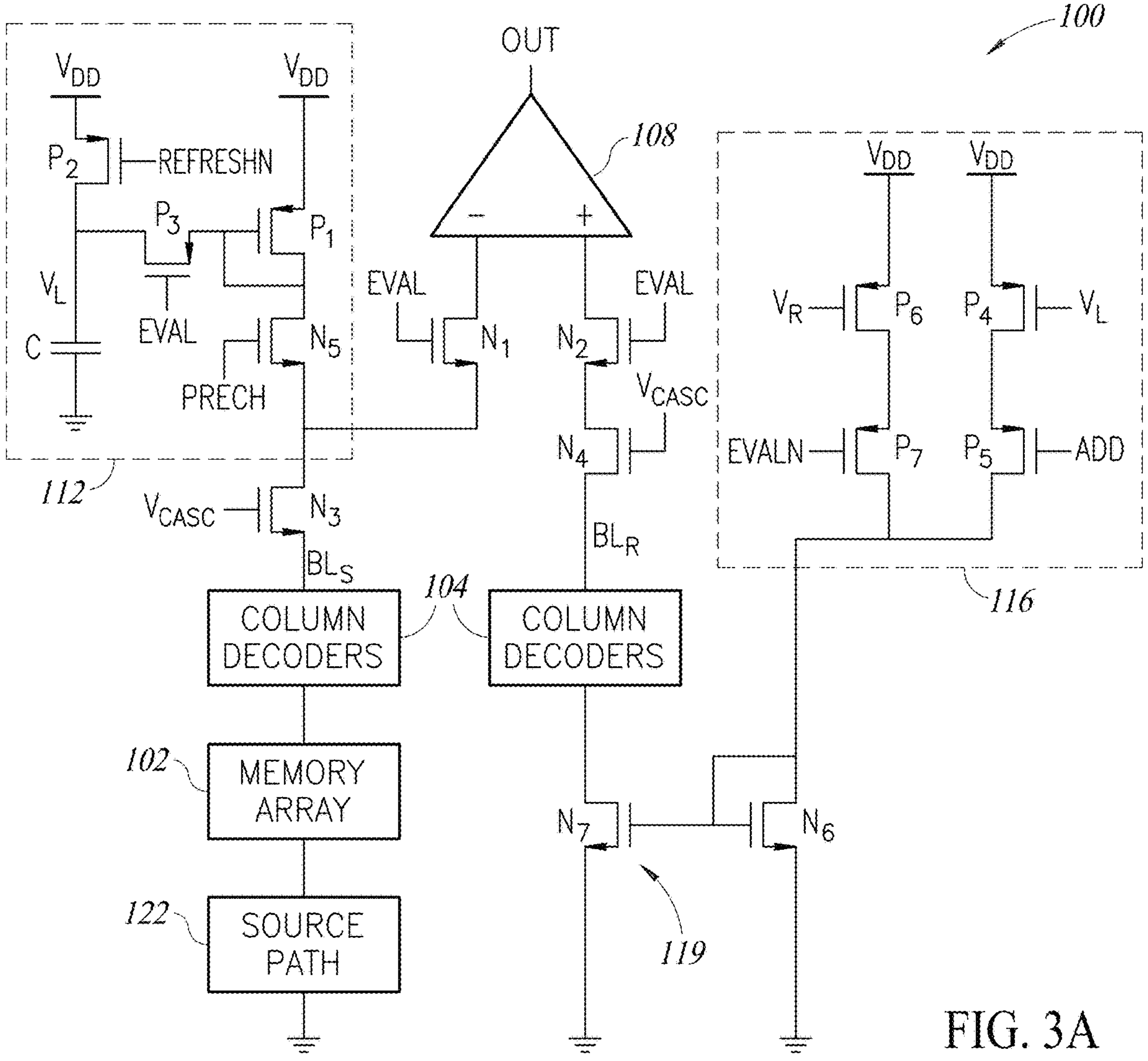
FIG. 3A is a schematic diagram of memory reading circuitry of an integrated circuit, according to one embodiment.

FIG. 3A is a schematic diagram of the integrated circuit 100, according to one embodiment. The integrated circuit 100 of FIG. 3A is substantially similar to the integrated circuit 100 of FIG. 2, except that the circuitry of the leakage detector and leakage adder are shown in FIG. 3A.

Leakage detector 112 includes an NMOS transistor N5 having a source terminal coupled to the source terminal of the transistor N1 and the drain terminal of the transistor N3. The gate terminal of N5 receives the precharge signal PRECH. The leakage detector 112 also includes a PMOS transistor P1 having a source terminal coupled to the supply voltage VDD, a drain terminal coupled to the drain terminal of the transistor N5, and a gate terminal coupled to the drain terminal of P1. The leakage detector 112 includes a PMOS transistor P3 having a source terminal coupled to the gate terminal of the transistor P1. The gate terminal of the transistor P3 receives EVAL. The leakage detector includes a capacitor C coupled between the drain terminal of the transistor P3 and ground. The leakage detector 112 includes a PMOS transistor P2 having a source terminal coupled to the supply voltage VDD, a gate terminal that receives the control signal REFRESHN, and a drain terminal coupled to the drain terminal of P3 and the capacitor.

The leakage adder 116 includes the PMOS transistors P6 and P7. P6 has a source terminal coupled to the supply voltage VDD, a gate terminal that receives a reference voltage VR, and the drain terminal coupled to the source terminal of P7. The gate terminal of P7 receives EVAL. The reference voltage VR is selected to cause a reference current to flow through the transistors P6 and P7, when EVAL is high. P6 and P7 control the flow of the base reference current through the reference bitline BLR.

The leakage adder 116 includes PMOS transistors P4 and P5. The PMOS transistors P4 and P5 control the flow of the leakage compensation current through the reference bitline BLR. The source of P4 is coupled to VDD. The gate terminal of P4 receives the leakage voltage VL from the capacitor C. The drain of P4 is coupled to the source of P5. The gate of P5 receives the control signal ADD. ADD has either a high or low value depending on the output of the leakage comparator 114. If ADD is high, then the leakage compensation current can flow through P4 and P5. VL biases P4 to pass the leakage compensation current equal to the leakage current detected by the leakage detector 112.

The base portion of the reference current flows through the transistors P6 and P7. The leakage compensation current portion of the reference current flows through the transistors P4 and P5. The base portion of the reference current in the leakage compensation current flows through NMOS transistor N6. The transistor N6 is coupled in the current mirror configuration with NMOS transistor N7. Namely, the source terminals of the transistors N6 and N7 are coupled to ground. The gate terminals of N6 and N7 are coupled to each other. The drain terminal of N6 is coupled to the drain terminals of P5 and P7. The reference current flows through N6 and is the sum of the base reference current flowing through P6 and P7 and the leakage compensation current flowing through P4 and P5.

Due to the current mirror configuration of N7 and N6, N7 passes the same current as N6. Accordingly, N7 passes the reference current including the base reference current and the leakage compensation current. This causes the reference current to flow through the reference bitline BLR when EVAL is high.

Figure 3B:
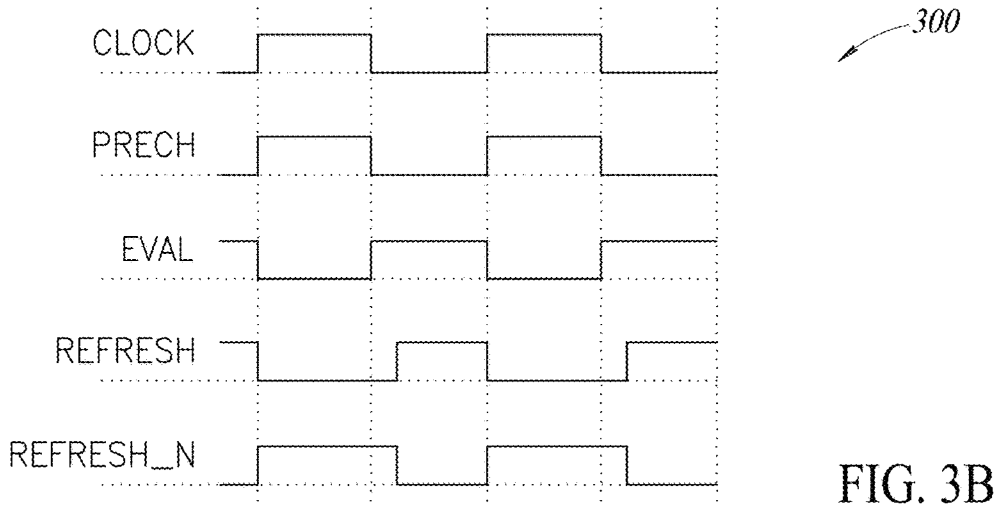
FIG. 3B is a timing diagram illustrating the relative timing of various signals associated with a read operation of a memory array, according to one embodiment.

FIG. 3B is a timing diagram 300 of the control signals illustrating some of the control signals of FIG. 3A, according to one embodiment. The timing diagram 300 illustrates a clock signal that alternates with a selected frequency. The timing diagram 300 also illustrates the precharge signal PRECH that matches the clock signal, i.e., PRECH is high when the clock signal is high, and PRECH is low when the clock signal is low. The timing diagram 300 also illustrates the evaluation signal EVAL. EVAL is the logical complement of PRECH. When PRECH is high, EVAL is low. When PRECH is low, EVAL is high. The timing diagram 300 also illustrates the signals REFRESH and REFRESHN. REFRESHN is the logical compliment of REFRESH.

With reference to FIGS. 3A and 3B, a read operation of a memory cell of the memory array 102 begins when the precharge signal PRECH goes high and while EVAL is low. With PRECH high and EVAL low, the transistors N5 and P3 are enabled. At this time, the bitline of the selected transistor in the memory array 102 has been coupled to BLS, but the selected memory cell itself has not yet been enabled. At this time, the source path 122 is also enabled. This causes the leakage current associated with the transistors of the selected bitline of the memory array 102 to flow through the transistor N5 and through the transistor P3. When the precharge signal first goes high, the voltage across the capacitor is VDD. This is because REFRESHN turns on the transistor P2 and charges the capacitor C to VDD during a portion of the evaluation period. But when precharge goes high, the transistor P2 is off because REFRESHN is high. The leakage current thus flows from the capacitor C through the transistors P3 and N5. Accordingly, the leakage current causes the voltage on the capacitor C to drop in accordance with the relationship:

$$I = C * dv/dt.$$

Accordingly, the voltage VL across the terminals of the capacitor when the precharge signal goes low again is based on the magnitude of the leakage current during the period of time that P3 and N5.

After the precharge signal goes low, the leakage current no longer flows through the leakage detector 112. At this time, the evaluation signal goes high, enabling transistors N1 and N2. The selected memory cell of the memory array 102 is also enabled, causing the full sense current to flow through the sensing bitline BLS. The full sense current includes the current that flows from the selected memory cell 110 and the leakage current flowing from the other memory cells coupled to the sensing bitline BLS. The full sensing current passes from the inverting terminal of the sense amplifier 108 to the transistors N1 and N3.

While the evaluation signal is high, the leakage voltage VL is supplied to the transistor P4 of the leakage adder 116. This causes a leakage compensation current to flow through the transistors P4 and P5, assuming that ADD is low. Additionally, when the evaluation signal is high and EVALN is low, the reference biasing voltage VR is provided to the gate terminal P6, causing a base reference current to flow through P6 and P7. The sum of the base reference current and the leakage compensation current flows through the transistor N6 while the evaluation signal is high. This causes the full reference current, including the base reference current and the leakage compensation current, to flow through the reference bitline BLR. The reference current BLR flows from the noninverting output of the sense amplifier 108 through the transistors N2 and N4. The sense amplifier 108 then compares the full sensing current to the full reference current and outputs a signal based on a comparison. The output of the sense amplifier while EVAL is high indicates the value of the data stored in the selected memory cell 110 of the memory array 102.

Figure 3C:
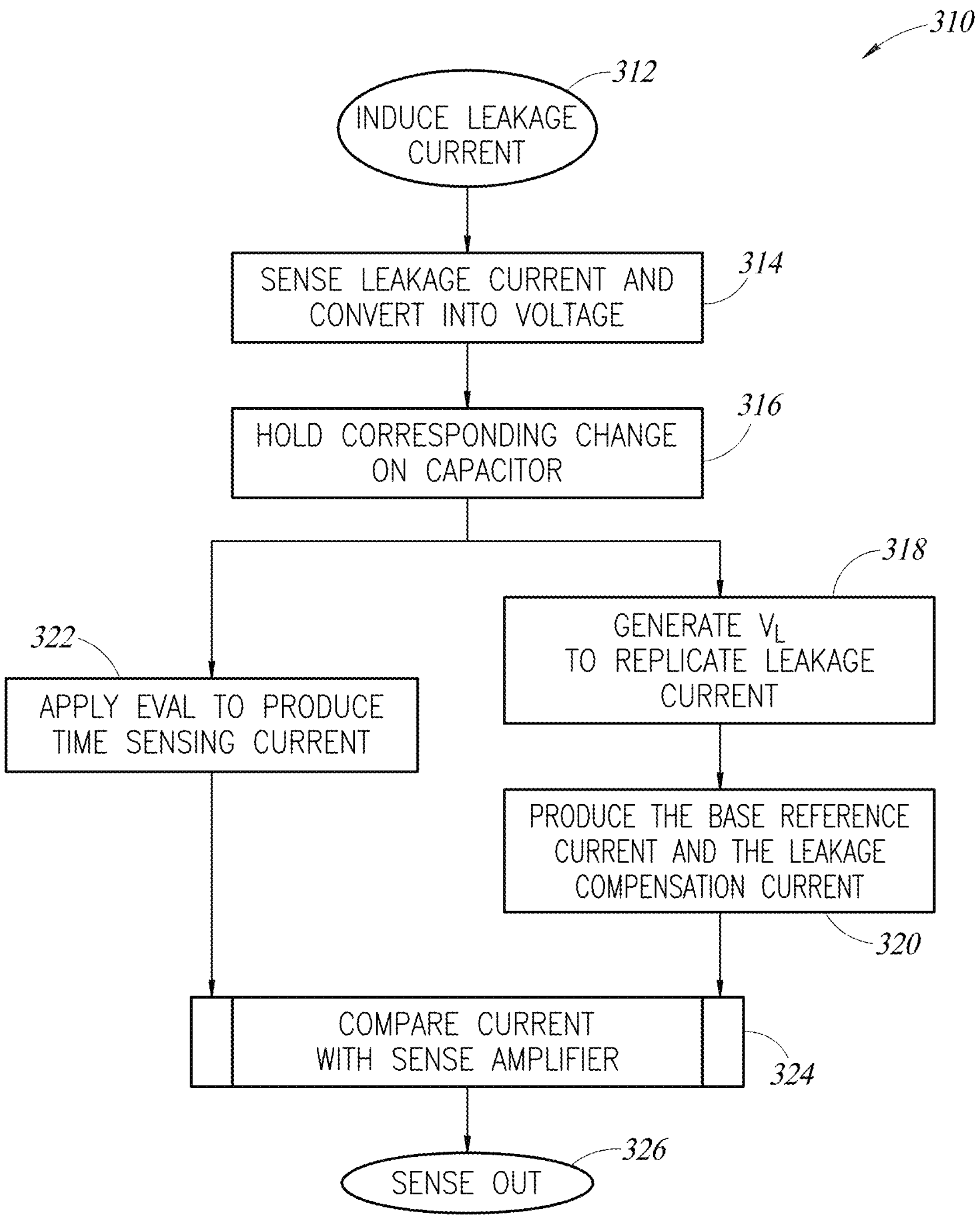
FIG. 3C is a flow diagram of a process for reading data from a memory cell, according to one embodiment.

FIG. 3C is a flow diagram of a process 310 for reading data from a memory cell in the integrated circuit 100 of FIG. 3A, according to one embodiment. At 312, the leakage current is induced to flow through the leakage detector 112 by making PRECH and REFRESHN high, while EVAL is low. At 314, the leakage detector 112 senses the leakage current and generates a leakage voltage VL indicative of the magnitude of the leakage current. At 316, leakage voltage VL is held at the capacitor C. At 318, EVAL goes high and VL is applied to the gate terminal of the transistor P4 to replicate leakage current. At 320, leakage adder 116 produces the base reference current and the leakage compensation current while EVAL is high. At 322, while EVAL is high, the sensing current is produced including the cell current flowing from the selected memory cell and the leakage current flowing from the memory cells coupled to the same bitline. At 324 the sense amplifier 108 compares the sensing current to the reference current. At 326, the sense amplifier 108 outputs the voltage indicative of the value of the data stored in the selected memory cell.

Figure 4:
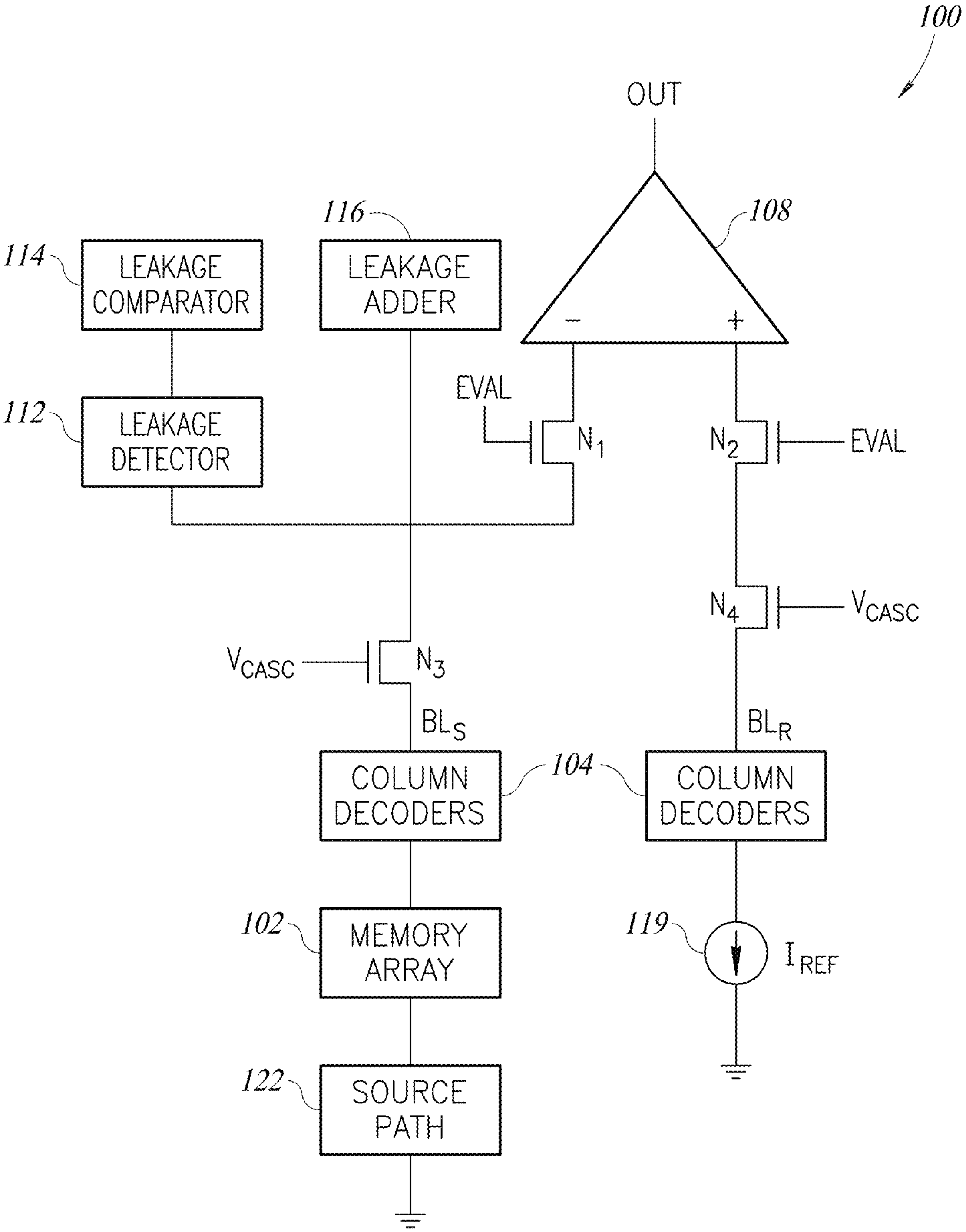
FIG. 4 is a schematic diagram of memory reading circuitry of an integrated circuit, according to one embodiment.

FIG. 4 is a schematic diagram of an integrated circuit 100, according to one embodiment. The integrated circuit 100 is similar in many ways to the integrated circuit 100 of FIG. 2, except that the leakage adder 116 is coupled to the sensing bitline BLS. In this case, after the leakage detector 112 has sensed the leakage current while EVAL is low as described previously, the leakage adder 116 draws the leakage current from the sensing bitline BLS while EVAL is high. Accordingly, in this case, the leakage adder 116 takes a current equal to the leakage current sensed by the leakage detector 112 from the bitline BLS while EVAL is high. Accordingly, the sense amplifier 108 passes only the cell current through the selected bitline BLS. Thus, the leakage current is not added to the reference current in this example. As described previously, the leakage comparator 114 can determine whether the leakage adder 116 should draw a current from the bitline BLS while EVAL is high.

Figure 5:
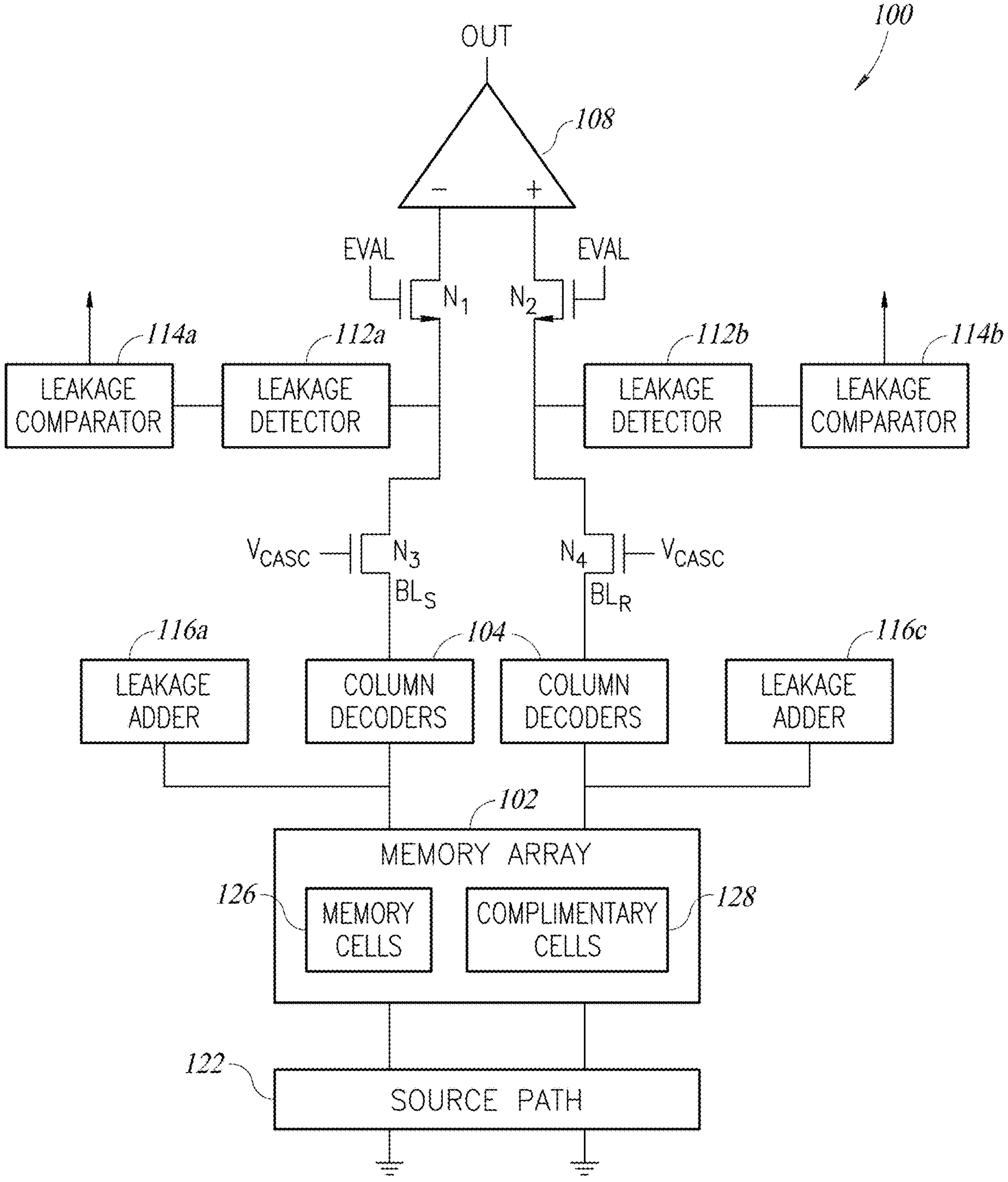
FIG. 5 is a schematic diagram of memory reading circuitry of an integrated circuit, according to one embodiment.

FIG. 5 is a schematic diagram of an integrated circuit 100, according to one embodiment. In FIG. 5, the data sensing scheme is a differential data sensing scheme. In this case, the memory array 102 includes the memory cells 110 and complementary memory cells 128. The complementary memory cells include, for each memory cell 110, a complementary memory cell 128. The complementary memory cell stores data of the opposite value as the corresponding memory cell 110.

During a read operation of the memory cell 110, the bitline of the memory cell is coupled to the sensing bitline BLS via the column decoders 104. A complementary bitline coupled to the complementary memory cell is coupled to the reference bitline BLR. In this case, the reference bitline BLR can be termed a complementary sensing bitline. The sense amplifier 108 compares the current flowing through the sensing bitline BLS to the current flowing through the reference bitline BLR and outputs a signal indicative of the value of the data stored in the selected memory cell 110.

In the embodiment of FIG. 5, a first leakage detector 112*a* and a first leakage comparator 114*a* are coupled to the sensing bitline BLS, in a substantially similar manner as described in relation to FIG. 2. A second leakage detector 112*b* and a second leakage comparator 114*b* are coupled to the reference bitline BLR. A first leakage adder 116*a* is coupled to the sensing bitline BLS in the same manner that leakage adder 116 is coupled to the reference bitline in FIG. 2. A second leakage adder 116*b* is coupled to the reference bitline BLR in the same manner that the leakage adder 116 is coupled to the reference bitline in FIG. 2.

The first leakage detector 112*a* detects the value of the leakage current (first leakage current) flowing through the sensing bitline BLS during the precharge phase. The first leakage comparator 114*a* determines whether the first leakage current is high enough to warrant generating a leakage compensation current and the reference bitline BLR. The second leakage detector 112*b* detects the value of the leakage current (second leakage current) flowing through the reference bitline BLR during the precharge phase. The second leakage comparator 114*b* determines whether the second leakage current is high enough to warrant generating a leakage compensation current and the sensing bitline BLS. When EVAL is high, the second leakage adder 116*b* adds a second leakage compensation current equal to the first leakage current to the reference bitline BLR. When EVAL is high, the first leakage adder 116*a* adds a first leakage compensation current equal to the second leakage current to the sensing bitline BLS.

Accordingly, in the embodiment of FIG. 5, the leakage current from the complementary memory cells is added to the sensing bitline BLS. The leakage current from the direct memory cells 110 is added to the reference bitline BLS. This ensures that the sense amplifier will not output an erroneous data value due to the presence of leakage currents. The leakage detectors 112*a*, 112*b*, the leakage comparators 114*a*, 114*b* and the leakage adders 116*a*, 116*b* can operate in substantially the same manner as described in relation to FIGS. 1-3C. The leakage detectors 112*a*, 112*b*, the leakage comparators 114*a*, 114*b* and the leakage adders 116*a*, 116*b* collectively correspond to a leakage current compensation circuit 106.

Figure 6:
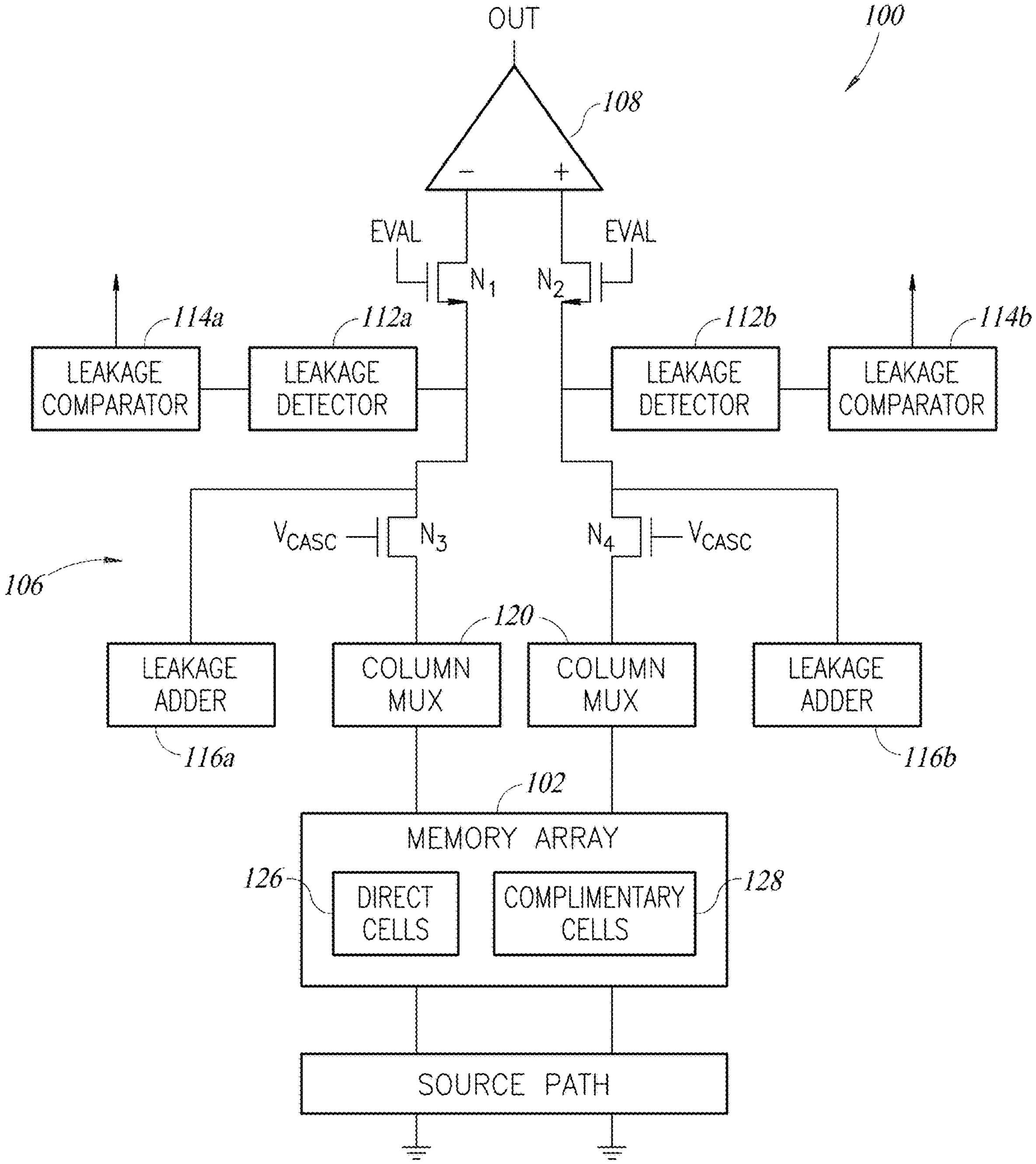
FIG. 6 is a schematic diagram of memory reading circuitry of an integrated circuit, according to one embodiment.

FIG. 6 is a schematic diagram of an integrated circuit 100, according to one embodiment. The integrated circuit 100 of FIG. 6 is substantially similar to the integrated circuit 100 of FIG. 5, except that the leakage adders 116*a* and 116*b* operate like the leakage adder 116 of FIG. 4. In particular, the leakage adder 116*a* draws a leakage compensation current from the sensing bitline BLS equal to the leakage current measured by the leakage detector 112*a*. Likewise, the leakage adder 116*b* draws a leakage compensation current from the reference bitline BLS equal to the leakage current measured by the leakage detector 112*b*.

Figure 7:
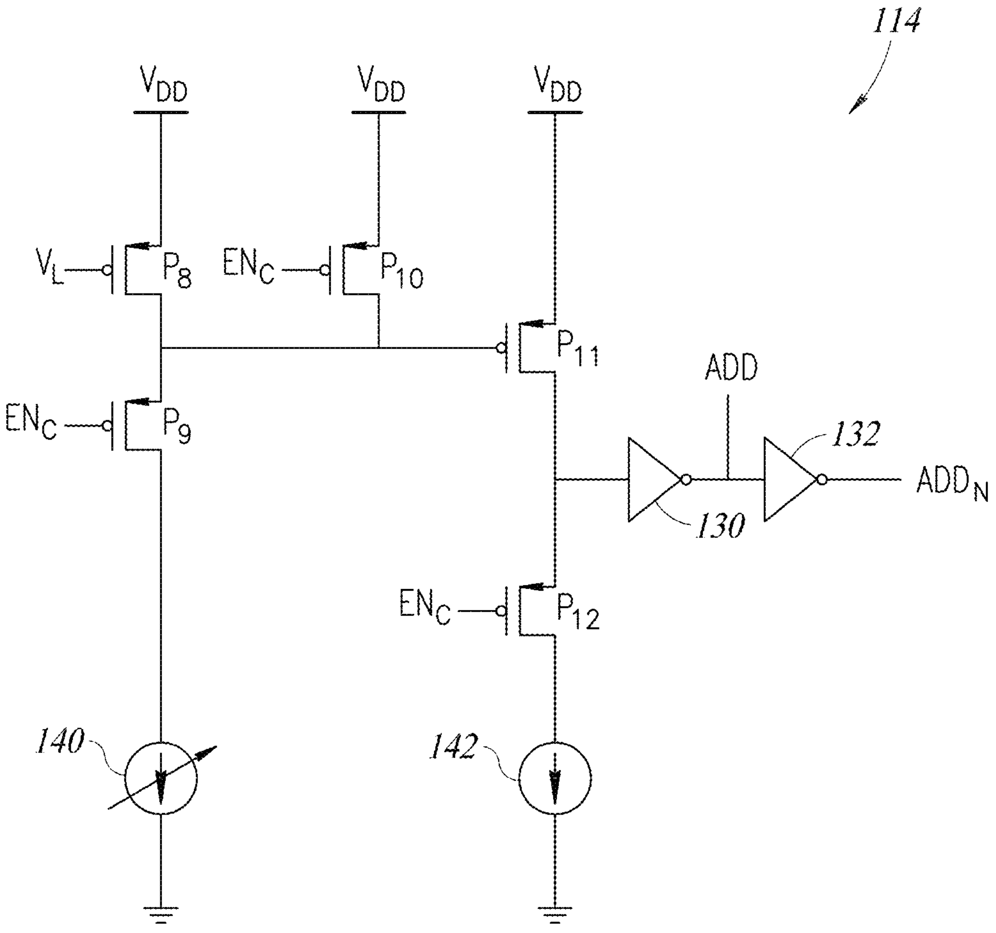
FIG. 7 is a schematic diagram of memory reading circuitry of an integrated circuit, according to one embodiment.

FIG. 7 is a schematic diagram of a leakage comparator 114, according to one embodiment. The leakage comparator 114 is one example of a leakage comparator that can be utilized in FIGS. 1-6.

The leakage comparator 114 includes PMOS transistors P8 and P9 coupled in series with a variable current source 142. The source terminal of P8 is coupled to VDD. The source terminal P9 is coupled to the drain terminal of P8. The drain terminal of P9 is coupled to the variable current source 142. The gate terminal P8 receives the leakage voltage VL described in relation to FIGS. 3A-3C. The leakage voltage VL is indicative of the magnitude of the leakage current sensed by the leakage detector 112. The gate terminal of P9 receives a comparison enable signal ENC.

The leakage comparator 114 includes PMOS transistors P10, P11, and P12. The source terminal of P10 is connected to VDD. The gate terminal of P10 receives the comparison enable signal ENC. The drain terminal of P10 is coupled to the drain terminal of P8, the source terminal of P9, and the gate terminal of P11. The source terminal P11 is coupled to VDD. The drain terminal of P11 is coupled to the source terminal of P12. The drain terminal P12 is coupled to a current source 142. The gate terminal P12 receives the comparison enable signal ENC.

The leakage comparator 114 includes a first inverter 130 and a second inverter 132. The input of the inverter 130 is coupled to the drain terminal of P11. The output of the inverter 130 is coupled to the input of the inverter 132. The output of the inverter 130 is the signal ADD that determines whether leakage compensation current will be added as shown in FIG. 3A. The output of the inverter 132 is the logical complement ADDN and ADD. If VL is sufficiently high, then ADD will be high and the leakage compensation current will be added to the reference bitline BLR or the sensing bitline BLS, as the case may be.

Figure 8A:
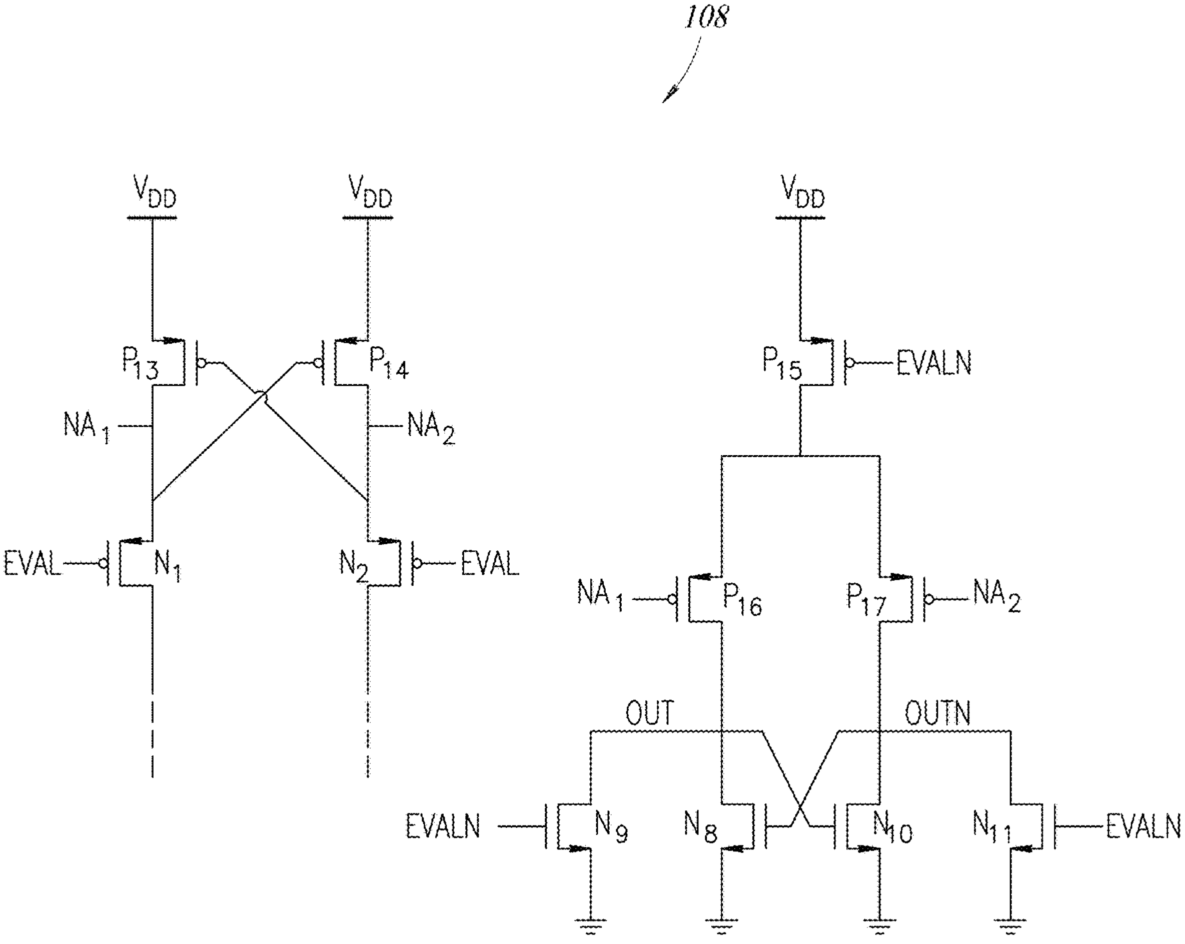
FIG. 8A is a schematic diagram of a sense amplifier, according to one embodiment.

FIG. 8A is a schematic diagram of a sense amplifier 108, according to one embodiment. The sense amplifier 108 includes PMOS transistors P13 and P14. The source terminals of P13 and P14 are coupled to VDD. The gate terminal of P13 is coupled to the drain terminals of P14 and N2. The gate terminal of P14 is coupled to the drain terminals of P13 and N1.

The sense amplifier 108 includes PMOS transistors P15, P16, and P17. The sense amplifier 108 includes N loss transistors N8, N9, N10, and N11. The source terminal of P15 is coupled to VDD. The gate terminal of P15 receives the complementary evaluation signal EVALN. The drain terminal of P15 is coupled to the source terminals of P16 and P17. The gate terminal of P16 receives voltage NA1 from the drain terminal of P13. The gate terminal of P17 receives voltage NA2 from the drain terminal of P14. The drain terminal of P16 is coupled to the drain terminals of N8 and N9, as well as to the gate terminal of N10. The voltage at the drain terminal of P16 is the output voltage OUT of the sense amplifier 108. The drain terminal of P17 is coupled to the drain terminals of N10 and N11, as well as to the gate terminal of N8. The voltage at the drain terminal of P17 is the complementary output voltage OUTN of the sense amplifier 108. OUTN is the logical complement of OUT. The output voltage OUT indicates the data value stored in the selected memory cells 110. The gate terminals of N9 and N11 receive the complementary evaluation signal EVALN. The source terminals of N8-N11 are coupled to ground.

Figure 8B:
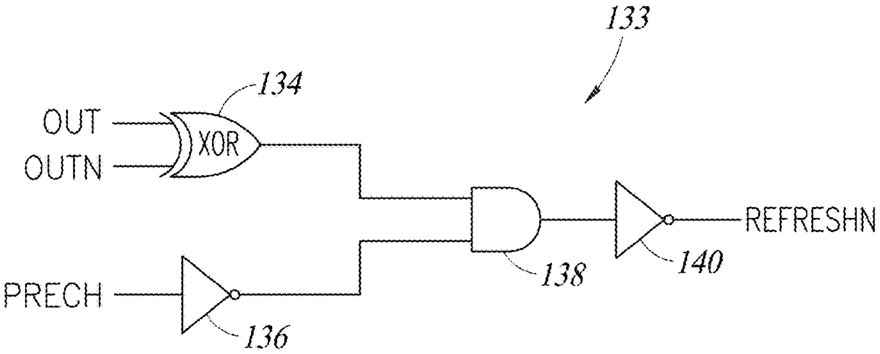
FIG. 8B is a schematic diagram of a circuit for generating a refresh signal, according to one embodiment.

FIG. 8B is a schematic diagram of a circuit 133 for generating the signal REFRESHN that is applied to the transistor P2 of the leakage adder 112 as described in relation to FIG. 3A. The circuit 133 includes an XOR gate 134, in inverter 136, an AND gate 138, and an inverter 140. The XOR gate 134 receives as inputs, OUT and OUTN. The input of the inverter 136 receives the precharge signal PRECH. The AND gate 138 receives, as inputs, the output of the XOR gate 134 and the output of the inverter 136. The output of the AND gate 138 is coupled to the input of the inverter 140. The output of the inverter 140 is the signal REFRESHN. The input of the inverter 140 is the signal REFRESH.

Figure 9:
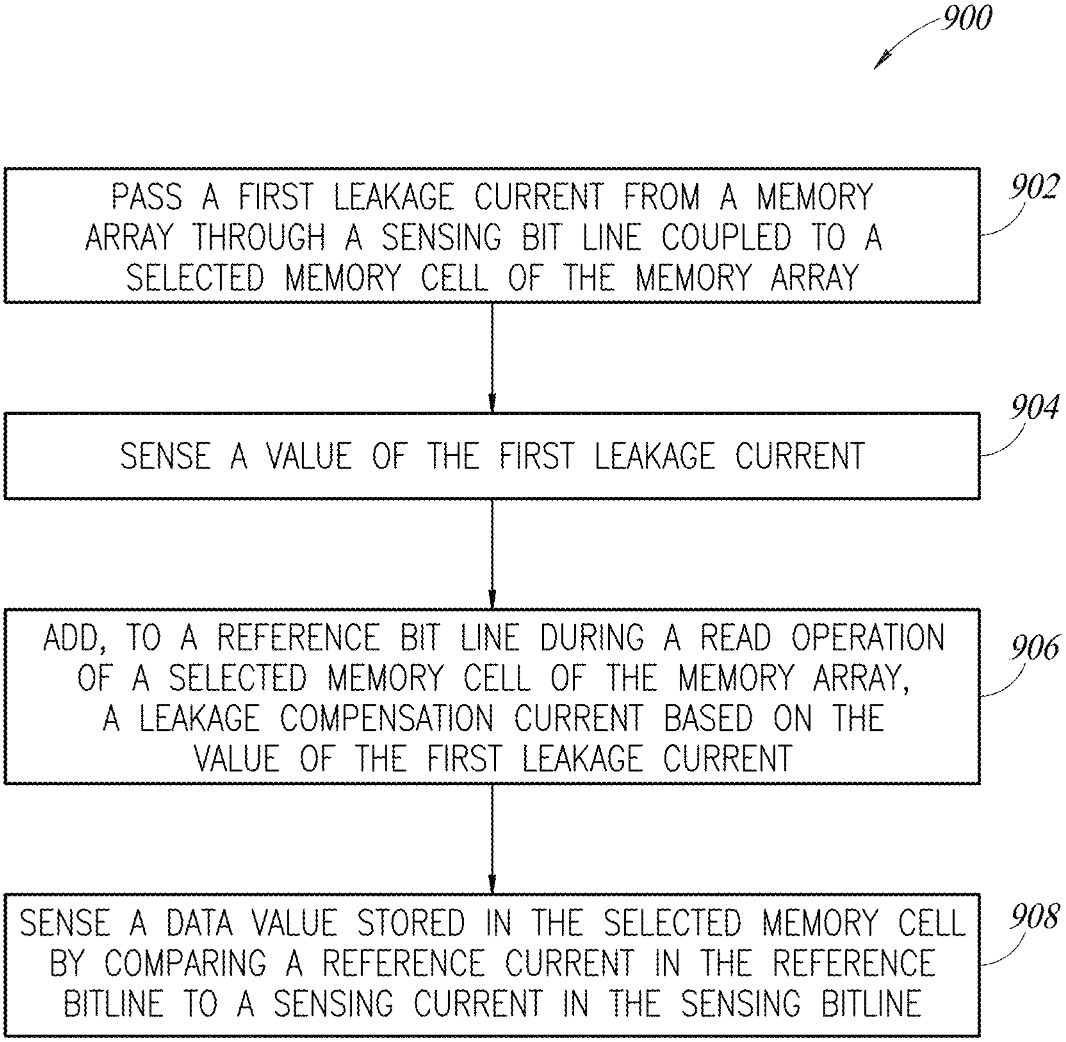
FIG. 9 is a flow diagram of a method for reading data from a memory cell, according to one embodiment.

FIG. 9 is a flow diagram of a method 900 reading data from a memory cell, according to one embodiment. At 902, the method 900 includes passing a first leakage current from a memory array through a sensing bit line coupled to a selected memory cell of the memory array. At 904, the method 900 includes sensing a value of the first leakage current. At 906, the method 900 includes adding, to a reference bitline during a read operation of a selected memory cell of the memory array, a leakage compensation current based on the value of the first leakage current. At 908, the method 900 includes sensing a data value stored in the selected memory cell by comparing a reference current in the reference bitline to a sensing current in the sensing bitline.

Figure 10:
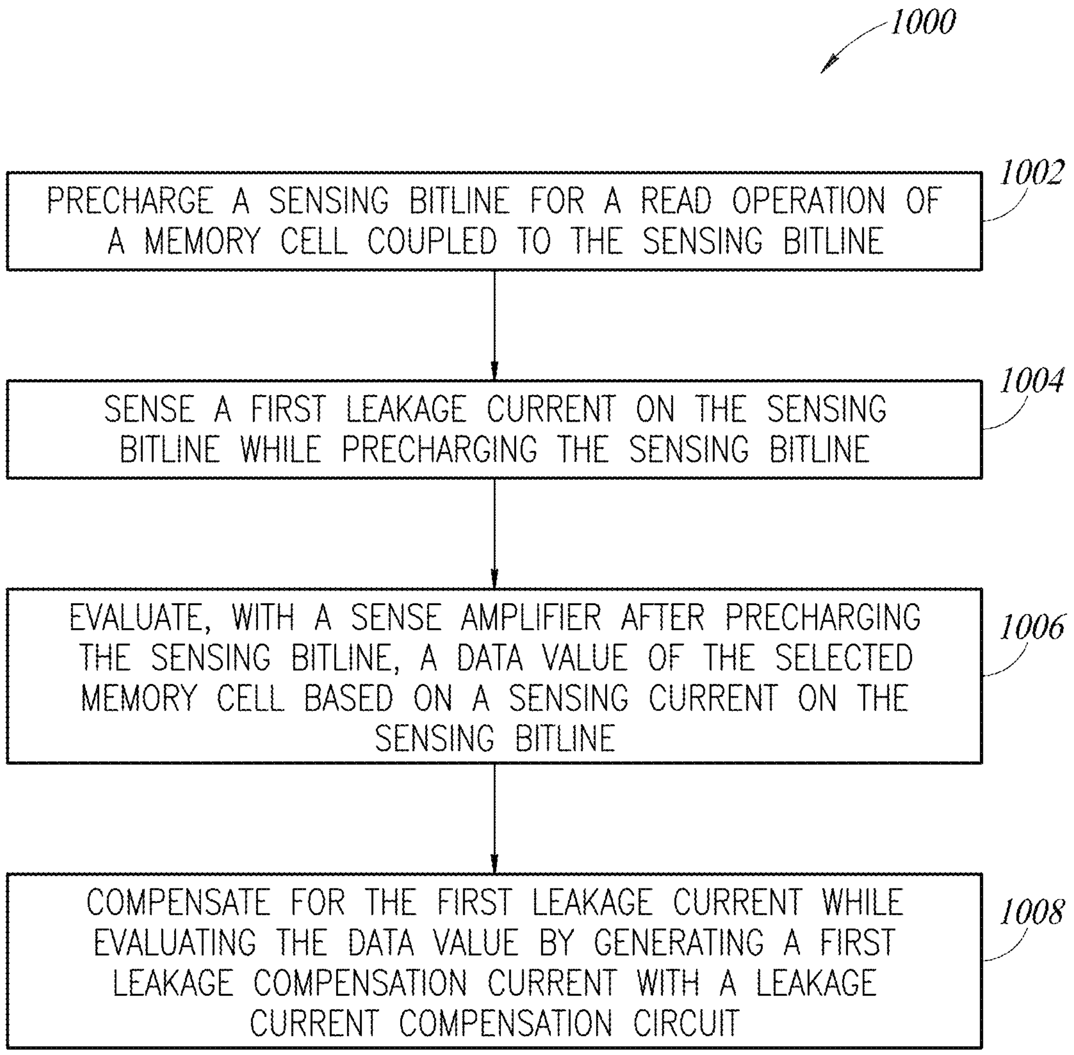
FIG. 10 is a flow diagram of a method for reading data from a memory cell, according to one embodiment.

FIG. 10 is a flow diagram of a method 1000 for reading data from a memory cell, according to one embodiment. At 1002, the method 1000 includes precharging a sensing bitline for a read operation of a memory cell coupled to the sensing bitline. At 1004, the method 1000 includes sensing a first leakage current on the sensing bitline while precharging the sensing bitline. At 1006, the method 1000 includes evaluating, with a sense amplifier after precharging the sensing bitline, a data value of the selected memory cell based on a sensing current on the sensing bitline. At 1008, the method 1000 includes compensating for the first leakage current while evaluating the data value by generating a first leakage compensation current with a leakage current compensation circuit.

One embodiment is a method for reading data from a memory cell. The method includes passing a first leakage current from a memory array through a sensing bitline coupled to a selected memory cell of the memory array and includes sensing a value of the first leakage current. The method includes adding, to a reference bitline during a read operation of a selected memory cell of the memory array, a leakage compensation current based on the value of the first leakage current. The method includes sensing a data value stored in the selected memory cell by comparing a reference current in the reference bitline to a sensing current in the sensing bitline.

One embodiment is a method for reading data from a memory cell, the method includes precharging a sensing bitline for a read operation of a memory cell coupled to the sensing bitline and sensing a first leakage current on the sensing bitline while precharging the sensing bitline. The method includes evaluating, with a sense amplifier after precharging the sensing bitline, a data value of the selected memory cell based on a sensing current on the sensing bitline. The method includes compensating for the first leakage current while evaluating the data value by generating a first leakage compensation current with a leakage current compensation circuit.

One embodiment is an integrated circuit including a memory array including a plurality of memory cells, a sensing bitline coupled to the memory array, and a reference bitline. The integrated circuit includes a leakage current compensation circuit coupled to the sensing bitline and the reference bitline and configured to sense a first leakage current on the sensing bitline and to add a first leakage compensation current to the reference bitline during a read operation of a selected memory cell of the plurality of memory cells. The integrated circuit includes a sense amplifier coupled to the sensing bitline and the reference bitline and configured to sense a data value stored in the selected memory cell by comparing a sensing current in the sensing bitline to a reference current in the reference bitline.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

precharging a sensing bitline for a read operation of a memory cell coupled to the sensing bitline;

sensing a first leakage current on the sensing bitline while precharging the sensing bitline;

evaluating, with a sense amplifier after precharging the sensing bitline, a data value of the memory cell based on a sensing current on the sensing bitline;

comparing, with a leakage comparator, the first leakage current to a threshold value; and compensating for the first leakage current while evaluating the data value by generating a first leakage compensation current with a leakage current compensation circuit responsive to the leakage comparator comparing the first leakage current to the threshold value.

2. The method of claim 1, further comprising adding the first leakage compensation current to a reference bitline coupled to the sense amplifier.

3. The method of claim 1, wherein generating the first leakage compensation current includes drawing the first leakage compensation current from the sensing bitline.

4. The method of claim 3, further comprising:

precharging a reference bitline for the read operation of the memory cell coupled to the sensing bitline;

sensing a second leakage current on the reference bitline while precharging the reference bitline; and compensating for the second leakage current while evaluating the data value by generating a second leakage compensation current with the leakage current compensation circuit.

5. The method of claim 4, further comprising adding the second leakage compensation current to the reference bitline while evaluating the data value.

6. The method of claim 1, wherein the first leakage current flows from a plurality of memory cells that are not selected for the read operation.

7. The method of claim 1, wherein a complimentary memory cell stores a data value opposite to the data value stored by the memory cell, wherein a reference bitline is coupled to the complimentary memory cell during the read operation.

8. An integrated circuit, comprising:

a memory cell;

a sensing bitline coupled to the memory cell, wherein the sensing bitline is precharged for a read operation of the memory cell;

a leakage current compensation circuit coupled to the sensing bitline, wherein the leakage current compensation circuit is configured to sense a first leakage current on the sensing bitline while the sensing bitline is precharged;

a leakage comparator configured to compare the first leakage current to a threshold value; and a sense amplifier configured to evaluate, after precharging the sensing bitline, a data value of the memory cell based on a sensing current on the sensing bitline, and wherein the leakage current compensation circuit configured to generate, responsive to the leakage comparator comparing the first leakage current to the threshold value, a first leakage compensation current for compensating the first leakage current while the data value is evaluated.

9. The integrated circuit of claim 8, wherein the first leakage compensation current is added to a reference bitline coupled to the sense amplifier.

10. The integrated circuit of claim 8, wherein the leakage current compensation circuit is configured to generate the first leakage compensation current by drawing the first leakage compensation current from the sensing bitline.

11. The integrated circuit of claim 10, further comprising:

a reference bitline configured to be precharged for the read operation of the memory cell; and a leakage detector configured to sense a second leakage current on the reference bitline while precharging the reference bitline, wherein the leakage current compensation circuit is configured to generate a second leakage compensation current for compensating the second leakage current.

12. The integrated circuit of claim 11, further comprising:

an adder configured to add the second leakage compensation current to the reference bitline while the data value is evaluated.

13. The integrated circuit of claim 8, wherein the first leakage current flows from a plurality of memory cells that are not selected for the read operation.

14. The integrated circuit of claim 8, wherein a complimentary memory cell stores a data value opposite to the data value stored by the memory cell, wherein a reference bitline is coupled to the complimentary memory cell during the read operation.

15. A system, comprising:

a memory array including a plurality of memory cells;

a sensing bitline coupled to a memory cell of the plurality of memory cells, wherein the sensing bitline is precharged for a read operation of the memory cell;

a leakage current compensation circuit coupled to the sensing bitline, wherein the leakage current compensation circuit is configured to sense a first leakage current on the sensing bitline while the sensing bitline is precharged;

a leakage comparator configured to compare the first leakage current to a threshold value and a sense amplifier configured to evaluate, after precharging the sensing bitline, a data value of the memory cell based on a sensing current on the sensing bitline and output the data value, and wherein the leakage current compensation circuit is configured to generate, responsive to the leakage comparator comparing the first leakage current to the threshold value, a first leakage compensation current for compensating the first leakage current while the data value is evaluated.

16. The system of claim 15, wherein the first leakage compensation current is added to a reference bitline coupled to the sense amplifier.

17. The system of claim 15, wherein the leakage current compensation circuit is configured to generate the first leakage compensation current by drawing the first leakage compensation current from the sensing bitline.

18. The system of claim 17, further comprising:

a reference bitline configured to be precharged for the read operation of the memory cell; and a leakage detector configured to sense a second leakage current on the reference bitline while precharging the reference bitline, wherein the leakage current compensation circuit is configured to generate a second leakage compensation current for compensating the second leakage current while the data value is evaluated.

19. The system of claim 18, further comprising:

an adder configured to add the second leakage compensation current to the reference bitline.

20. The system of claim 15, wherein the first leakage current flows from a plurality of memory cells that are not selected for the read operation.

* * * * *